US009953829B2

(12) United States Patent
Masuda et al.

(10) Patent No.: US 9,953,829 B2
(45) Date of Patent: Apr. 24, 2018

(54) IMAGE PROCESSING APPARATUS WITH IMPROVED SLIDE PRINTOUT BASED ON LAYOUT DATA

(71) Applicant: Toshiba Memory Corporation, Minato-ku (JP)

(72) Inventors: Hideaki Masuda, Nagoya (JP); Nobuhide Yamada, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/002,483

(22) Filed: Jan. 21, 2016

(65) Prior Publication Data

US 2017/0062202 A1 Mar. 2, 2017

Related U.S. Application Data

(60) Provisional application No. 62/210,803, filed on Aug. 27, 2015.

(51) Int. Cl.
*H01L 21/31* (2006.01)
*H01L 21/02* (2006.01)

(52) U.S. Cl.
CPC ...... *H01L 21/022* (2013.01); *H01L 21/02274* (2013.01)

(58) Field of Classification Search
None
See application file for complete search history.

(56) References Cited

U.S. PATENT DOCUMENTS 8,741,394 B2 * 6/2014 Haverkamp ............ C23C 16/24
427/534
8,771,417 B2 * 7/2014 Yoon .................. H01J 37/32357
118/715

(Continued)

FOREIGN PATENT DOCUMENTS

JP 8-45910 2/1996
JP 11-307454 11/1999

(Continued)

OTHER PUBLICATIONS

English translation JP2013207277, downloaded online Feb. 24, 2017. 14 pgs.*

(Continued)

*Primary Examiner* — David E Graybill
(74) *Attorney, Agent, or Firm* — Oblon, McClelland, Maier & Neustadt, L.L.P.

(57) ABSTRACT

A semiconductor manufacturing method includes setting a relative position between first through holes of a first plate-shaped part and second through holes of a second plate-shaped part to a first relative position. The method includes supplying a first gas containing a component of the first film onto the semiconductor substrate in a reactor through the first through holes not closed with the second plate-shaped part, to form the first film on the semiconductor substrate. The method includes relatively moving the first plate-shaped part and the second plate-shaped part to change the relative position to a second relative position. The method includes supplying a second gas containing a component of the second film onto the semiconductor substrate through the first through holes not closed with the second plate-shaped part, to laminate the second film on the first film.

13 Claims, 5 Drawing Sheets

(56) References Cited

U.S. PATENT DOCUMENTS

| | | | |
|---|---|---|---|
| 9,129,778 B2* | 9/2015 | Huseinovic | H01J 37/3244 |
| 2005/0167052 A1* | 8/2005 | Ishihara | H01J 37/32834 |
| | | | 156/345.47 |
| 2006/0102286 A1* | 5/2006 | Kim | C23C 16/452 |
| | | | 156/345.35 |
| 2007/0095283 A1* | 5/2007 | Galewski | C23C 16/4412 |
| | | | 118/715 |
| 2010/0206231 A1* | 8/2010 | Yoon | H01J 37/32357 |
| | | | 118/723 I |
| 2011/0236594 A1* | 9/2011 | Haverkamp | C23C 16/24 |
| | | | 427/553 |
| 2012/0135145 A1* | 5/2012 | Je | C23C 16/45565 |
| | | | 427/248.1 |
| 2013/0171834 A1* | 7/2013 | Haverkamp | C23C 16/24 |
| | | | 438/763 |

FOREIGN PATENT DOCUMENTS

| | | | |
|---|---|---|---|
| JP | 2001-53065 | | 2/2001 |
| JP | 2005213570 A | * | 8/2005 |
| JP | 2006225759 A | * | 8/2006 |
| JP | 2013207277 A | * | 10/2013 |
| JP | 2015119177 A | * | 6/2015 |

OTHER PUBLICATIONS

English translation JP2015119177, downloaded online Feb. 24, 2017. 24 pgs.*

* cited by examiner

IMAGE PROCESSING APPARATUS WITH IMPROVED SLIDE PRINTOUT BASED ON LAYOUT DATA

CROSS REFERENCE TO RELATED APPLICATIONS

This application is based upon and claims the benefit of priority from the prior U.S. Provisional Patent Application No. 62/210,803 filed on Aug. 27, 2015, the entire contents of which are incorporated herein by reference.

FIELD

Embodiments relate to a semiconductor manufacturing method.

BACKGROUND

Conventionally, a manufacturing process of a semiconductor device uses a CVD apparatus that forms a film by a CVD (Chemical Vapor Deposition) method. The CVD apparatus includes a diffusion plate that straightens a process gas for film deposition in a chamber. The diffusion plate has a plurality of through holes allowing the process gas to pass therethrough toward a wafer. The position and the opening area of each through hole and the number of the through holes are designed to provide a desired distribution of a film thickness in a plane of the wafer (hereinafter, also "in-plane distribution").

In recent years, a lamination deposition process has been developed in which plural types of films are laminated in the same chamber. In a case of applying the diffusion plate to the lamination deposition process, the through holes can be designed to provide a desired in-plane distribution of a film thickness for one type of film. However, an in-plane distribution of a film thickness for other types of films is degraded under such specialized design of through holes for the one type of film.

DETAILED DESCRIPTION

A semiconductor manufacturing method according to an embodiment uses a semiconductor manufacturing apparatus including a reactor capable of accommodating a semiconductor substrate therein and allowing a gas used for film deposition on the semiconductor substrate to be introduced thereinto, a first plate-shaped part arranged in the reactor and having a plurality of first through holes, and a second plate-shaped part arranged in the reactor on a gas-downstream side of the first plate-shaped part to be opposed to the first plate-shaped part and having a plurality of second through holes. The semiconductor manufacturing method includes setting a relative position between the first through holes and the second through holes to a first relative position corresponding to a target in-plane distribution of a film thickness of a first film. The semiconductor manufacturing method includes supplying a first gas containing a component of the first film onto the semiconductor substrate in the reactor through any of the first through holes not closed with the second plate-shaped part at the first relative position, to form the first film on the semiconductor substrate. The semiconductor manufacturing method includes relatively moving the first plate-shaped part and the second plate-shaped part to change the relative position to a second relative position corresponding to a target in-plane distribution of a film thickness of a second film, the second relative position being different from the first relative position in the number, the cross-sectional area, or the positions of the first through holes overlapping with the second through holes. The semiconductor manufacturing method includes supplying a second gas containing a component of the second film onto the semiconductor substrate through the first through holes not closed with the second plate-shaped part at the second relative position, to laminate the second film on the first film.

Embodiments will now be explained with reference to the accompanying drawings. The present invention is not limited to the embodiments.

First Embodiment

Figure 1:
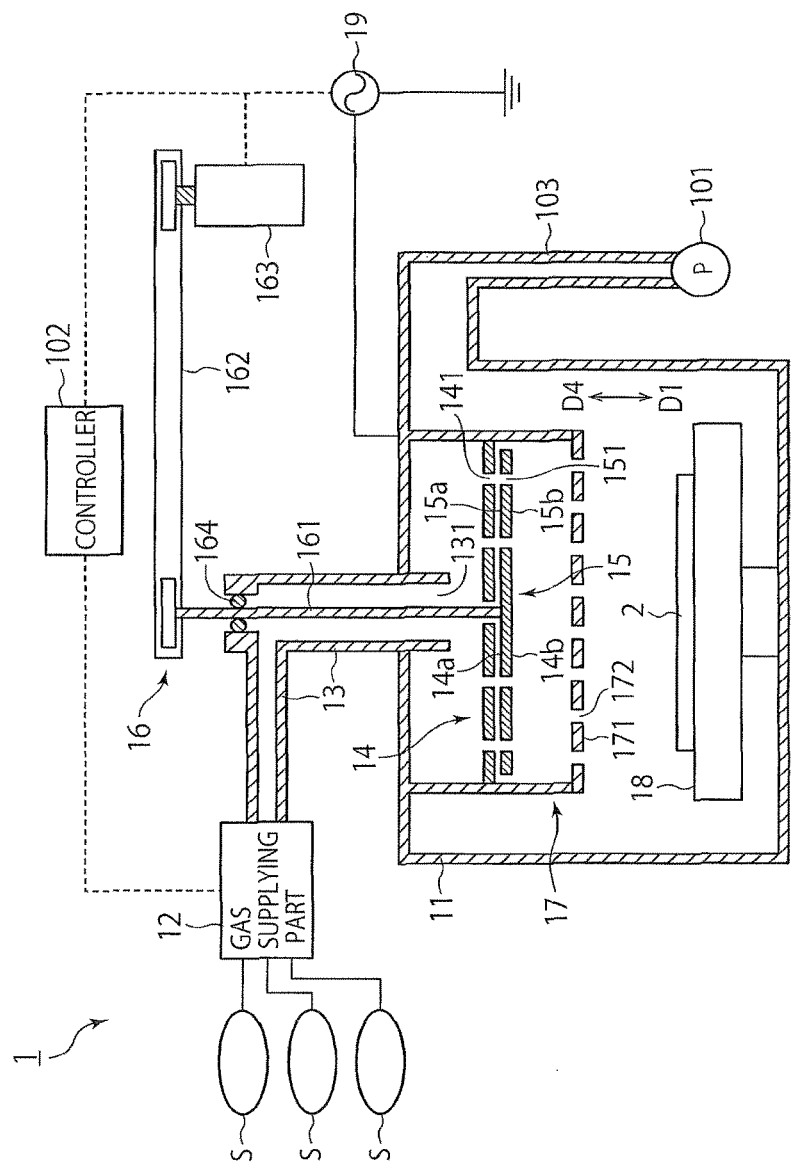
FIG. 1 is a schematic cross-sectional view of a semiconductor manufacturing apparatus according to a first embodiment.

An embodiment in which plasma is stopped when formation of a first film and formation of a second film are switched is described as a first embodiment. FIG. 1 is a schematic cross-sectional view of a semiconductor manufacturing apparatus according to the first embodiment. The semiconductor manufacturing apparatus 1 of FIG. 1 is a plasma CVD apparatus as an example of a single-wafer type CVD apparatus.

As shown in FIG. 1, the semiconductor manufacturing apparatus 1 includes a chamber 11 that is an example of a reactor, a gas supplying part 12, a gas introducing path 13, a first diffusion plate 14 as an example of a first plate-shaped part, a second diffusion plate 15 as an example of a second plate-shaped part, and a rotary mechanism 16. The semiconductor manufacturing apparatus 1 also includes an upper electrode 17, a lower electrode 18, a high-frequency power supply 19, a pump 101, and a controller 102.

The chamber 11 is capable of accommodating therein a semiconductor substrate 2 (a wafer) shown in FIG. 1. A gas used for film deposition on the semiconductor substrate 2 can be introduced into the chamber 11.

The gas supplying part 12 is connected to a gas source S of plural types of gases. The gas supplying part 12 alternately supplies a first gas containing a component of a first film and a second gas containing a component of a second film into the chamber 11 in order to form a laminated film including the first and second films alternately laminated on the semiconductor substrate 2.

For example, the first film is a silicon dioxide film and the second film is a silicon nitride film. The first gas containing the component of the silicon dioxide film, that is, a material gas of the silicon dioxide film may be TEOS (Tetra Ethyl Ortho Silicate) and oxygen gas. The second gas containing the component of the silicon nitride film, that is, a material gas of the silicon nitride film may be silane ($SiH_4$) gas and ammonia ($NH_3$) gas.

When the first film and the second film are to be formed, the gas supplying part 12 supplies a diluent gas diluting the first gas and the second gas into the chamber 11. The diluent gas is noble gas (inert gas), for example. The diluent gas for the first gas may be argon (Ar) gas. The diluent gas for the second gas may be nitrogen ($N_2$) gas. It is possible to easily generate plasma by diluting the first gas and the second gas.

The gas supplying part 12 may be constituted by a mass flow controller and a valve, for example.

The gas introducing path 13 connects the gas supplying part 12 and the chamber 11 to each other. The gas supplying part 12 supplies the first gas and the second gas into the chamber 11 through the gas introducing path 13.

Figure 2A:
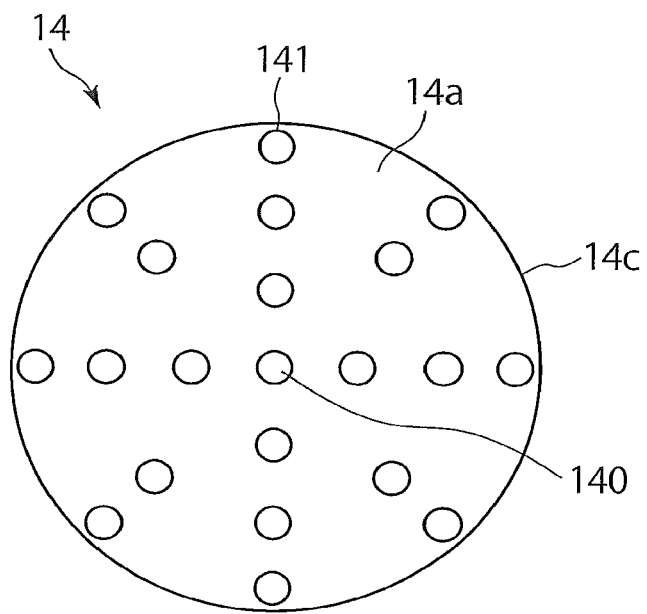
FIG. 2A is a plan view of a first diffusion plate in the semiconductor manufacturing apparatus according to the first embodiment.

FIG. 2A is a plan view of the first diffusion plate 14 in the semiconductor manufacturing apparatus 1 according to the first embodiment. As shown in FIG. 1, the first diffusion plate 14 is arranged on a downward direction D1 of an outlet 131 of the gas introducing path 13 to be opposed to the outlet 131 in the chamber 11. The first diffusion plate 14 has a flat front surface 14a, a flat back surface 14b, and a cylindrical outer circumferential surface 14c to have a disk shape, as shown in FIGS. 1 and 2A. The first diffusion plate 14 includes a plurality of first through holes 141 penetrating through the front surface 14a and the back surface 14b. In FIG. 2A, the first through holes 141 each have a circular shape having the same inner diameter, and are arranged radially to be concentric with the first diffusion plate 14. A specific mode of the first through hole 141 is not limited to that shown in FIG. 2A. The first diffusion plate 14 further has one through hole 140 for allowing a support 161 described later (see FIG. 1) to pass therethrough at its center.

Figure 2B:
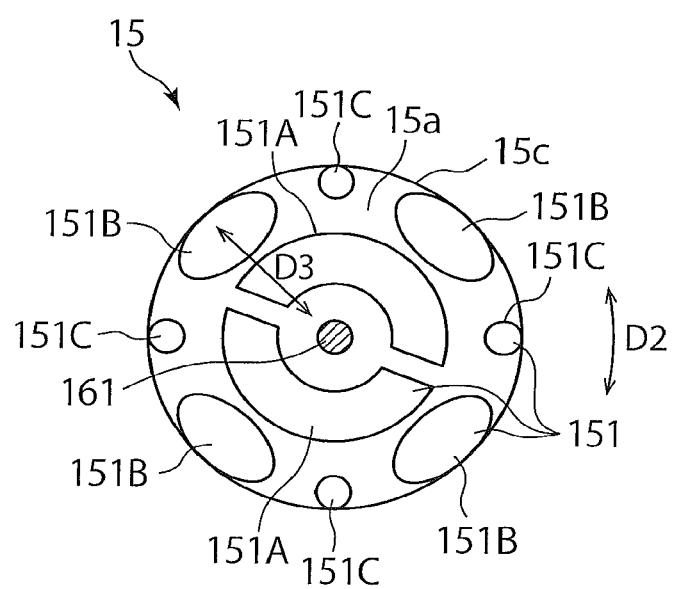
FIG. 2B is a plan view of a second diffusion plate.

FIG. 2B is a plan view of the second diffusion plate 15. As shown in FIG. 1, the second diffusion plate 15 is arranged on a gas-downstream side (on the downward direction D1 in FIG. 1) of the first diffusion plate 14 to be opposed to the first diffusion plate 14 in the chamber 11. The second diffusion plate 15 is opposed to the first diffusion plate 14 with a predetermined gap therebetween. Due to the gap between the first diffusion plate 14 and the second diffusion plate 15, the second diffusion plate 15 does not contact the first diffusion plate 14 during rotation of the second diffusion plate 15 described later. Because contact between the first diffusion plate 14 and the second diffusion plate 15 does not occur, dust generation by the first diffusion plate 14 and the second diffusion plate 15 can be suppressed. It is desirable that the gap between the first diffusion plate 14 and the second diffusion plate 15 is small from a viewpoint of highly precisely controlling a flow rate of a gas passing through the first diffusion plate 14 at the second diffusion plate 15. For example, the gap can be about 1 mm. The second diffusion plate 15 may be in contact with the first diffusion plate 14.

The second diffusion plate 15 has a flat front surface 15a, a flat back surface 15b, and a cylindrical outer circumferential surface 15c to have a disk shape concentric with the first diffusion plate 14, as shown in FIGS. 1 and 2B. The second diffusion plate 15 includes a plurality of second through holes 151 penetrating through the front surface 15a and the back surface 15b. The second through holes 151 are different from the first through holes 141 in at least one of the number, the cross-sectional area, and the horizontal positions of the through holes. In FIG. 2B, the second through holes 151 include two arc-shaped through holes 151A around center of the second diffusion plate 15 and four elliptical through holes 151B and four circular through holes 151C all arranged in a peripheral portion of the second diffusion plate 15. The arc-shaped second through hole 151A and the elliptical second through hole 151B have an inner circumference larger than that of the first through hole 141. The elliptical second through hole 151B has a dimension in a radial direction D3 that continuously changes along a circumferential direction (a rotational direction) D2.

A specific mode of the second through hole 151 is not limited to that shown in FIG. 2B. For example, the inner circumference of at least one of the second through holes 151A to 151C may be formed to be smaller than that of the first through hole 141.

Among the first through holes 141, holes overlapping with any of the second through holes 151 in a vertical direction and holes located outside an outer peripheral end of the second diffusion plate 15 in the radial direction D3 are not closed with the second diffusion plate 15. The first through hole 141 overlaps with the second through hole 151 in an entire region of its cross section in some cases, and overlaps with the second through hole 151 in a portion of its cross section in other cases. Further, the first through hole 141 is not closed with the second diffusion plate 15 in the entire region of its cross section in some cases, and is not closed with the second diffusion plate 15 in a portion of its cross section in other cases.

The diffusion plate 14 alternately supplies the first gas and the second gas onto the semiconductor substrate 2 in the chamber 11 through the first through hole 141 not closed with the second diffusion plate 15 out of the plural first through holes 141. The first gas and the second gas are diffused by passing through the first through hole 141. Due to the diffusion of the first gas and the second gas, it is possible to prevent a flow of the first gas and a flow of the second gas from concentrating at the center of the chamber 11. This allows easy control of an in-plane distribution of a film thickness of each of the first film and the second film.

The rotary mechanism 16 can rotate the second diffusion plate 15. Specifically, the rotary mechanism 16 includes the support 161, a power transmission member 162, and a servomotor 163, as shown in FIG. 1. The support 161 extends from the center portion of the second diffusion plate 15, passes through the through hole 140 of the first diffusion plate 14, and extends through the gas introducing path 13 toward an upward direction D4. A top end portion of the support 161 penetrates through the gas introducing path 13 to be exposed to the outside. Bearings 164 are provided between the gas introducing path 13 and the support 161 at a position where the support 161 penetrates through the gas introducing path 13. The bearings 164 maintain a vacuum state in the chamber 11, while supporting the support 161 in a rotatable manner. The power transmission member 162 is provided between the servomotor 163 and the top end portion of the support 161. The power transmission member 162 transmits a power of the servomotor 163 to the support 161. The power transmission member 162 may be a timing belt or a power transmission shaft, for example.

The rotary mechanism 16 rotates the second diffusion plate 15, thereby making relative positions between the first through holes 141 and the second through holes 151 different between when the first film is formed and when the second film is formed. By making the relative positions differ, at least one of the number, the cross-sectional area, and the positions of the first through holes 141 overlapping with the second through holes 151 can be changed. Due to this configuration, a flow rate and distribution of a gas can be changed between when the first film is formed and when the second film is formed, to obtain a desired in-plane distribution corresponding to each film.

The upper electrode (a shower head) 17 surrounds a certain region including the outlet 131 of the gas introducing path 13, the first diffusion plate 14, and the second diffusion plate 15 in the chamber 11. A bottom wall portion 171 of the upper electrode 17 is opposed to the second diffusion plate 15 on the downward direction D1 of the second diffusion plate 15. The bottom wall portion 171 has a plurality of through holes 172. The first gas and the second gas that are supplied onto the semiconductor substrate 2 through the first through holes 141 not closed with the second diffusion plate 15 pass through the through holes 172 of the upper electrode 17. The first gas and the second gas can be further diffused by passing through the through holes 172 of the upper electrode 17, than after passing through the first through holes 141.

The lower electrode 18 is arranged on the downward direction D1 of the upper electrode 17 in the chamber 11. The semiconductor substrate 2 can be mounted on the lower electrode 18. The lower electrode 18 includes a heater therein and heats the semiconductor substrate 2 mounted thereon with the heater to a predetermined temperature. Heating the semiconductor substrate 2 can increase a film deposition rate.

The high-frequency power supply 19 is connected to the upper electrode 17. The high-frequency power supply 19 applies a high-frequency electric power to the upper electrode 17. When a high-frequency electric power is applied to the upper electrode 17, the upper electrode 17 is capacitively coupled to the lower electrode 18 to supply an electric power into the chamber 11. The first gas and the second gas supplied into the chamber 11 in a vacuum state is plasmanized (that is, ionized) by the electric power supplied into the chamber 11. Consequently, the inside of the chamber 11 is filled with the plasmanized gas, and a film is deposited on the semiconductor substrate 2.

The pump 101 is connected to the chamber 11 via a pipe 103. The pump 101 evacuates the inside of the chamber 11 to bring the inside of the chamber 11 into a vacuum state. The pump 101 may be a dry pump, for example.

The controller 102 electrically controls an operation of the semiconductor manufacturing apparatus 1. For example, the controller 102 controls timings of supplying and stopping the gas by the gas supplying part 12, timings of applying and stopping the high-frequency electric power by the high-frequency power supply 19, and a timing rotating the second diffusion plate 15.

(Semiconductor Manufacturing Method)

Figure 3:
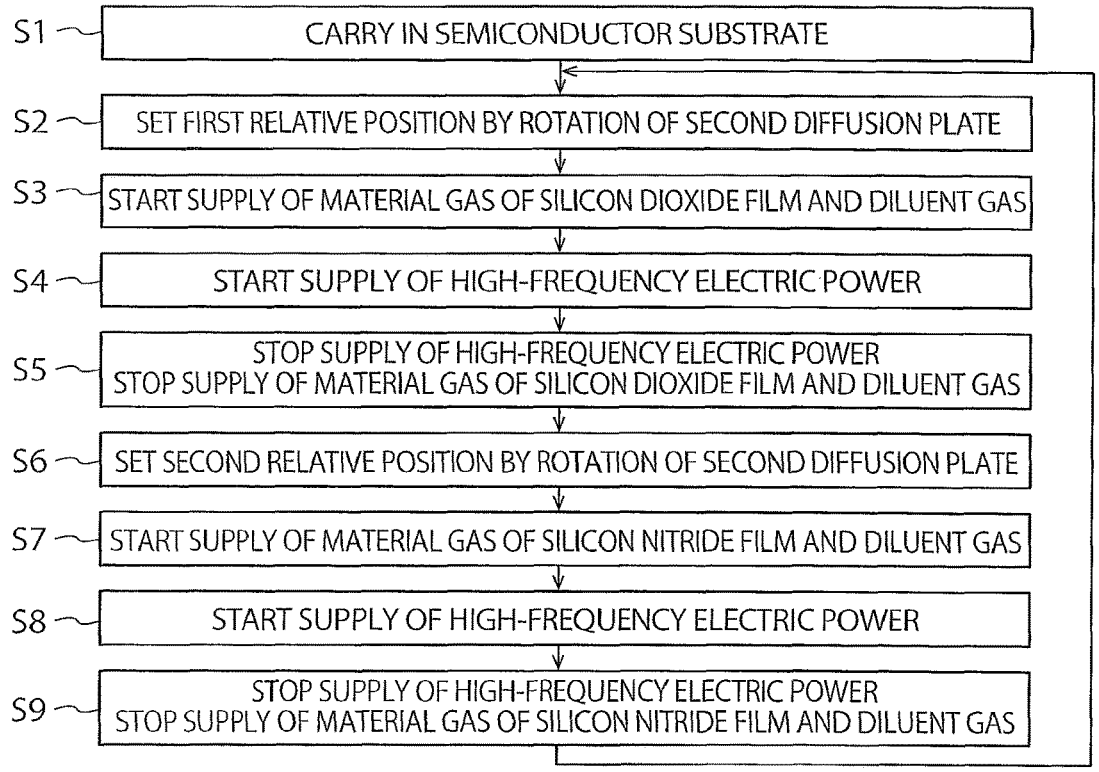
FIG. 3 is a flowchart of a semiconductor manufacturing method according to the first embodiment.
Figure 4:
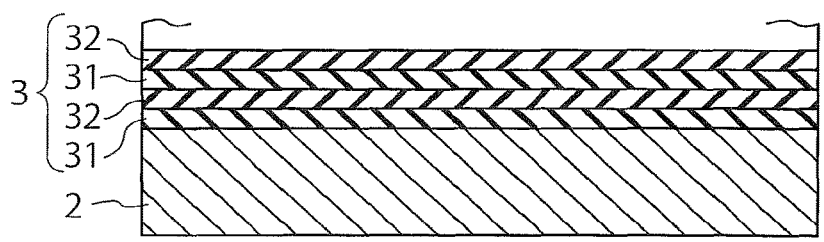
FIG. 4 is a schematic cross-sectional view of a laminated film formed by the semiconductor manufacturing method according to the first embodiment.

A semiconductor manufacturing method to which the semiconductor manufacturing apparatus 1 of FIG. 1 is applied is described. FIG. 3 is a flowchart of a semiconductor manufacturing method according to the first embodiment. FIG. 4 is a schematic cross-sectional view of a laminated film 3 formed by the semiconductor manufacturing method according to the first embodiment. In the following semiconductor manufacturing method, the laminated film 3 in which silicon dioxide films 31 as the first film and silicon nitride films 32 as the second film are laminated is formed on the semiconductor substrate 2, as shown in FIG. 4, for manufacturing a three-dimensional memory, for example.

In order to form the laminated film 3, the semiconductor manufacturing apparatus 1 first carries the semiconductor substrate 2 into the chamber 11, as shown in FIG. 3 (Step S1). The semiconductor substrate 2 can be carried by a delivery robot (not shown, such as an automatic FOUP transporting mechanism). The semiconductor substrate 2 carried into the chamber 11 is mounted on the lower electrode 18 with a lift pin, for example.

Figure 5A:
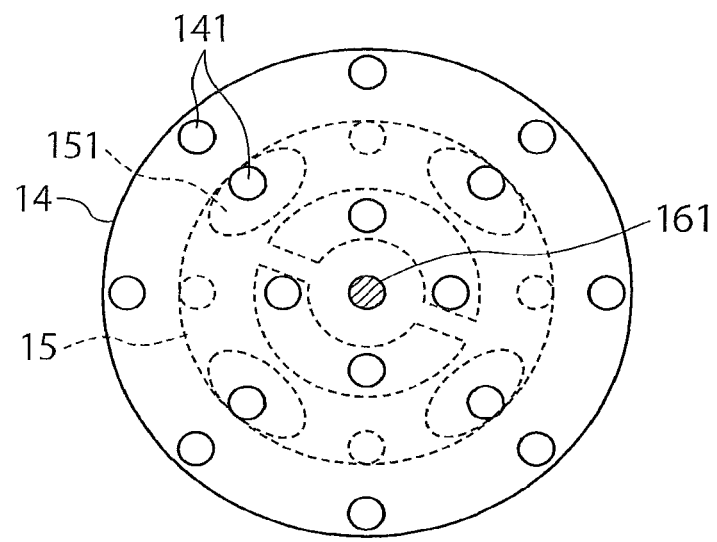
FIG. 5A is a plan view showing a first relative position corresponding to a target in-plane distribution of a film thickness of a silicon dioxide film in the semiconductor manufacturing method according to the first embodiment.

FIG. 5A is a plan view showing a first relative position corresponding to a target in-plane distribution of a film thickness of the silicon dioxide film 31 in the semiconductor manufacturing method according to the first embodiment.

After the semiconductor substrate 2 is carried in, the rotary mechanism 16 is controlled by the controller 102 to rotate the second diffusion plate 15 in the circumferential direction D2 by a predetermined angle, thereby setting a relative position between the first through holes 141 and the second through holes 151 to the first relative position corresponding to the target in-plane distribution of the film thickness of the silicon dioxide film 31 (Step S2 in FIG. 3). The target in-plane distribution of the film thickness of the silicon dioxide film 31 is a uniform in-plane distribution, for example.

In the example of FIG. 5A, all the first through holes 141 are not closed with the second diffusion plate 15 in an entire cross section thereof at the first relative position. The mode of the first relative position shown in FIG. 5A is only an example. The mode of the first relative position is not particularly limited, so long as it corresponds to the target in-plane distribution of the film thickness of the silicon dioxide film 31.

The gas supplying part 12 is then controlled by the controller 102 to start supply of a material gas of the silicon dioxide film 31 (for example, TEOS and $O_2$) and a diluent gas (for example, Ar) into the chamber 11, that is, onto the semiconductor substrate 2, as shown in FIG. 3 (Step S3). At this step, the heater of the lower electrode 18 heats the semiconductor substrate 2 to a predetermined temperature, and the pump 101 evacuates the inside of the chamber 11 to adjust the pressure in the chamber 11.

At this step, the material gas of the silicon dioxide film 31 supplied from the gas supplying part 12 is introduced into the chamber 11 via the outlet 131 after passing through the gas introducing path 13. The material gas of the silicon dioxide film 31 introduced into the chamber 11 passes through the first through holes 141 not closed with the second diffusion plate 15 and the through holes 172 of the upper electrode 17 to be supplied onto the semiconductor substrate 2, that is, between the upper electrode 17 and the lower electrode 18. Because the first through holes 141 are at the first relative position, the flow rate and the distribution of the material gas of the silicon dioxide film 31 are those corresponding to the target in-plane distribution of the film thickness of the silicon dioxide film 31. The diluent gas also passes through the same path as the material gas, to be supplied onto the semiconductor substrate 2.

Subsequently, the high-frequency power supply 19 is controlled by the controller 102 to start supply of a high-frequency electric power into the chamber 11 (Step S4).

At this time, the chamber 11 has been already evacuated to a vacuum state by the pump 101. The material gas of the silicon dioxide film 31 supplied onto the semiconductor substrate 2 is diluted with the diluent gas and is plasmanized (ionized) by the supply of the high-frequency electric power. Deposition species of the silicon dioxide film 31 generated by the plasmanization is polymerized on a surface of the semiconductor substrate 2, so that the silicon dioxide film 31 is formed on the semiconductor substrate 2, as shown in FIG. 4.

The silicon dioxide film 31 is deposited by executing control of the flow rate and the distribution of the material gas so as to correspond to the target in-plane distribution of the film thickness of the silicon dioxide film 31. Therefore, the resultant silicon dioxide film 31 has a desired in-plane distribution of a film thickness.

Subsequently, the high-frequency power supply 19 is controlled by the controller 102 to stop the supply of the high-frequency electric power into the chamber 11 (Step S5). At this time, the gas supplying part 12 is controlled by the controller 102 to stop the supply of the material gas of the silicon dioxide film 31 and the diluent gas into the chamber 11, that is, onto the semiconductor substrate 2 (Step S5). Because the pump 101 continues to operate at this time, the material gas of the silicon dioxide film 31 and the diluent gas are discharged from the chamber 11.

The controller 102 may stop the supply of the high-frequency electric power based on a fact that a predetermined time has passed from the start of the supply of the high-frequency electric power (Step S4). Also, the controller 102 may stop the supply of the material gas of the silicon dioxide film 31 and the diluent gas based on a fact that a predetermined time has passed from the start of the supply of the material gas of the silicon dioxide film 31 and the diluent gas (Step S3).

Figure 5B:
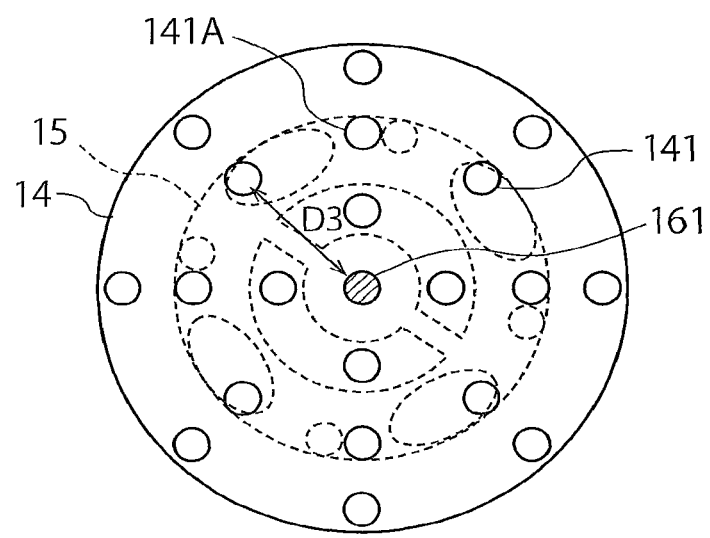
FIG. 5B is a plan view showing a second relative position corresponding to a target in-plane distribution of a film thickness of a silicon nitride film.

FIG. 5B is a plan view showing a second relative position corresponding to a target in-plane distribution of a film thickness of the silicon nitride film 32.

After the supply of the high-frequency electric power is stopped, the supply of the material gas of the silicon dioxide film is stopped, and the gases are discharged, the rotary mechanism 16 is controlled by the controller 102 to rotate the second diffusion plate 15 in the circumferential direction D2 by a predetermined angle. In this manner, the rotary mechanism 16 sets, that is, changes the relative position between the first diffusion plate 14 and the second diffusion plate 15 to the second relative position corresponding to a target in-plane distribution of a film thickness of the silicon nitride film 32 (Step S6). The target in-plane distribution of the film thickness of the silicon nitride film 32 is a uniform in-plane distribution, for example. The target in-plane distribution of the film thickness of the silicon nitride film 32 may be one obtained by inversing the in-plane distribution of the film thickness of the underlying silicon dioxide film 31. Employing the in-plane distribution obtained by inversing the in-plane distribution of the underlying layer can make the total film thickness uniform.

The second relative position is different from the first relative position in at least one of the number, the cross-sectional area, and the positions of the first through holes 141 overlapping with any of the second through holes 151. At the second relative position shown in FIG. 5B, for example, a hole 141A of the first through holes 141 that are located inside of the outer peripheral end of the second diffusion plate 15 in the radial direction D3 is closed with the second diffusion plate 15. The mode of the second relative position shown in FIG. 5B is only an example. The mode of the second relative position is not particularly limited, so long as it corresponds to the target in-plane distribution of the film thickness the silicon nitride film 32.

The gas supplying part 12 is then controlled by the controller 102 to start supply of a material gas of the silicon nitride film 32 (for example, SiH$_4$ and NH$_3$) and a diluent gas (for example, N$_2$) into the chamber 11, that is, onto the semiconductor substrate 2 (Step S7).

The material gas of the silicon nitride film 32 introduced into the chamber 11 passes through the first through holes 141 not closed with the second diffusion plate 15 and the through holes 172 of the upper electrode 17 to be supplied onto the semiconductor substrate 2, that is, between the upper electrode 17 and the lower electrode 18 in the same manner as the material gas of the silicon dioxide film 31. Because the first through holes 141 are at the second relative position, the flow rate and the distribution of the material gas of the silicon nitride film 32 are those corresponding to the target in-plane distribution of the film thickness of the silicon nitride film 32.

Subsequently, the high-frequency power supply 19 is controlled by the controller 102 to start supply of a high-frequency electric power into the chamber 11 (Step S8).

The material gas of the silicon nitride film 32 supplied onto the semiconductor substrate 2 is diluted with the diluent gas and is plasmanized by the supply of the high-frequency electric power. Deposition species of the silicon nitride film 32 generated by the plasmanization is polymerized on the surface of the semiconductor substrate 2, so that the silicon nitride film 32 is formed on the silicon dioxide film 31, as shown in FIG. 4.

The silicon nitride film 32 is deposited by executing control of the flow rate and the distribution of the second gas so as to correspond to the target in-plane distribution of the film thickness of the silicon nitride film 32. Therefore, the resultant silicon nitride film 32 has a desired in-plane distribution of a film thickness.

Subsequently, the high-frequency power supply 19 is controlled by the controller 102 to stop the supply of the high-frequency electric power into the chamber 11 (Step S9). At this time, the gas supplying part 12 is controlled by the controller 102 to stop the supply of the material gas of the silicon nitride film 32 and the diluent gas into the chamber 11 (Step S9). Because the pump 101 continues to operate at this time, the material gas of the silicon nitride film 32 and the diluent gas are discharged from the chamber 11.

The rotary mechanism 16 is then controlled by the controller 102 to set the relative position between the first diffusion plate 14 and the second diffusion plate 15 to the first relative position again (Step S2).

The above steps are repeated a corresponding number of times to the number of layers in the laminated film 3, so that the laminated film 3 shown in FIG. 4 is obtained. After the laminated film 3 is formed, the silicon nitride film 32 may be removed by wet etching (a hot phosphoric acid treatment), and a wiring layer, such as word lines and select gates of a three-dimensional memory, may be formed in a space formed by removal of the silicon nitride film 32.

According to the first embodiment, a relative position between the first through holes 141 and the second through holes 151 can be made different between when the silicon dioxide film 31 is formed and when the silicon nitride film 32 is formed. Therefore, it is possible to obtain a desired in-plane distribution of a film thickness of the silicon dioxide film 31 and a desired in-plane distribution of a film thickness of the silicon nitride film 32. In other words, a desired film thickness can be obtained as a film thickness of each layer in a laminated film. This can increase a yield of a semiconductor device involving formation of a laminated film.

According to the first embodiment, the relative position between the first through holes 141 and the second through holes 151 can be changed after stop of supply of a material gas of one of the silicon dioxide film 31 and the silicon nitride film 32 and discharge of the gas before start of supply of a material gas of the other film. Therefore, it is possible to switch the relative positions at a suitable timing at which the switching does not affect film deposition.

According to the first embodiment, the second diffusion plate 15 is rotated. Therefore, a power source can be reduced as compared with a case of rotating both the first diffusion plate 14 and the second diffusion plate 15.

According to the first embodiment, the second through holes 151 are different from the first through holes 141 in at least one of the number, the cross-sectional area, and the horizontal positions. Therefore, it is possible to increase variations of the modes of the first through holes 141 (the number, the range, and the positions) not closed with the second diffusion plate 15, as compared with a case of using the second through holes 151 that are congruent with the first through holes 141. As a result, the degree of freedom of design and the versatility to film types can be increased.

According to the first embodiment, at least one second through hole 151 is formed to have a shape in which the dimension in a radial direction changes continuously or gradually along a rotation direction (for example, an elliptical shape). Therefore, it is possible to perform fine adjustment of the cross-sectional area of the first through holes 141 overlapping with the second through holes 151 in accordance with a rotation angle of the second diffusion plate 15. This fine adjustment of the cross-sectional area of the first through holes 141 may be used for obtaining in-plane distributions that are slightly different, when a target in-plane distribution of a film thickness is slightly different between the silicon dioxide film 31 on a lower layer side and the silicon dioxide film 31 on an upper layer side.

Second Embodiment

An embodiment in which plasma is maintained when formation of a first film and formation of a second film are switched is described as a second embodiment.

Figure 6:
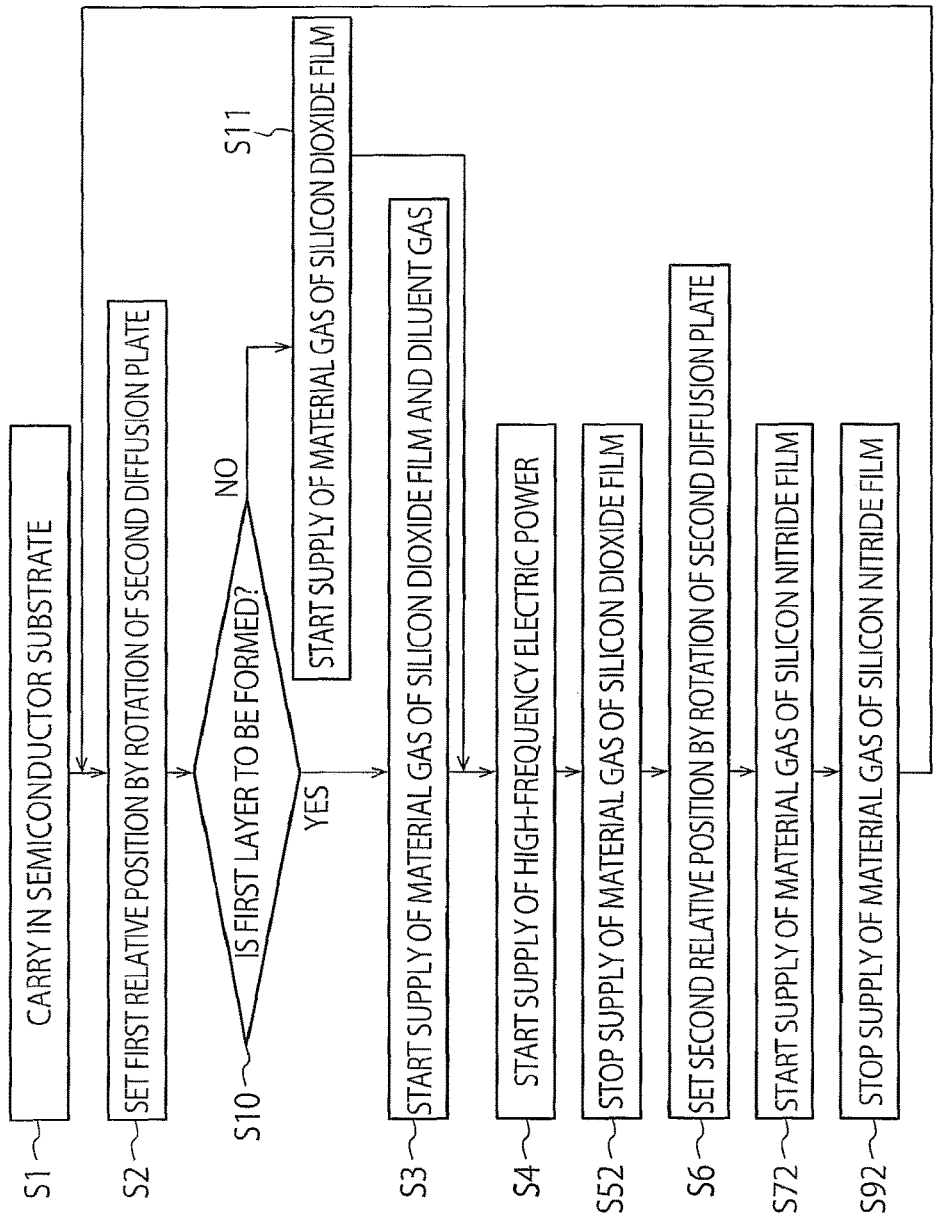
FIG. 6 is a flowchart of a semiconductor manufacturing method according to a second embodiment.

FIG. 6 is a flowchart of a semiconductor manufacturing method according to the second embodiment.

In the first embodiment, the supply of a diluent gas into the chamber 11 is stopped and the supply of a high-frequency electric power into the chamber 11 is also stopped, after the silicon dioxide film 31 is formed (see Step S5 in FIG. 3). Also, in the first embodiment, the supply of a diluent gas into the chamber 11 is stopped and the supply of a high-frequency electric power into the chamber 11 is also stopped, after the silicon nitride film 32 is formed (see Step S9 in FIG. 3).

On the other hand, in the second embodiment, only the supply of a material gas of the silicon dioxide film 31 is stopped but the supply of a diluent gas is not stopped (Step S52), after formation of the silicon dioxide film 31, as shown in FIG. 6. Also, the supply of a high-frequency electric power into the chamber 11 is not stopped.

In the second embodiment, when the supply of a material gas of the silicon nitride film 32 is stopped after formation of the silicon nitride film 32 (Step S92), the supply of a high-frequency electric power into the chamber 11 is not stopped.

That is, in the second embodiment, while plasma is generated after formation of the silicon dioxide film 31 (the first film), the supply of the material gas (the first gas) of the silicon dioxide film 31 is stopped, the material gas is discharged, and the second diffusion plate 15 is rotated for setting a second relative position.

In the second embodiment, while plasma is generated after formation of the silicon nitride film 32 (the second film), the supply of the material gas (the second gas) of the silicon nitride film 32 is stopped, the material gas is discharged, and the second diffusion plate 15 is rotated for setting a first relative position. In the second embodiment, in a case where, after setting of the first relative position (Step S2), a film to be formed in this film deposition is the silicon dioxide film 31 as the first layer (Step S10: Yes), both the supply of a material gas and the supply of a diluent gas are started (Step S3). In a case where the film to be formed in this film deposition is not the silicon dioxide film 31 as the first layer (Step S10: No), only the supply of the material gas of the silicon dioxide film 31 can be started (Step S11). The diluent gas is continuously supplied into the chamber 11 in order to keep a state where plasma is generated in the second embodiment. Therefore, in film deposition of the second and subsequent layers, it is not necessary to start the supply of a diluent gas again.

According to the second embodiment, it is possible to continue to generate plasma. Therefore, particles generated in the film deposition can be trapped in the plasma. This can suppress falling and adhesion of the particles onto the surface of the film every time the film types are switched, so that a desired in-plane distribution of a film thickness can be obtained more surely.

Other than the above points, operations and effects identical to those of the above embodiments can be provided by applying a plurality of modifications described below.

(Modifications)

In the above embodiments, the second diffusion plate 15 is rotated. Alternatively, the first diffusion plate 14 may be rotated in place of the second diffusion plate 15 to change a relative position between the first through holes 141 and the second through holes 151.

In the above embodiments, all the gases are introduced into the chamber 11 thorough a single gas introducing path 13. However, gas introducing paths that are different depending on the gas types may be provided. For example, a fluorine-based gas for cleaning the inside of the chamber 11 may be supplied into the chamber 11 through a gas introducing path different from that for a material gas.

These embodiments can be applied for manufacturing a semiconductor device including a laminated film by using thermal CVD, MO (Metal Organic) CVD, or LP (Low Pressure) CVD.

These embodiments can be applied for forming a laminated film of an oxide film and an amorphous silicon film, a laminated film of an oxide film and a polysilicon film, or a laminated film of an oxide film and a metal film in a manufacturing process of a semiconductor device.

These embodiments can be used for forming a laminated film of the same type of films having different film deposition conditions (for example, a silicon film with impurities doped therein and a silicon film with no impurities doped therein).

An additional rotatable diffusion plate may be provided other than the first diffusion plate 14 and the second diffusion plate 15.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing method using a semiconductor manufacturing apparatus comprising a reactor capable of accommodating a semiconductor substrate therein and allowing a gas used for film deposition on the semiconductor substrate to be introduced thereinto, a first plate part arranged in the reactor and comprising a plurality of first through holes each have a circular shape having the same inner diameter and are arranged radially to be concentric with the first plate part, and a second plate part arranged in the reactor on a gas-downstream side of the first plate part to be opposed to the first plate part and comprising a plurality of second through holes at least one of which is different from the first through holes in shape, the second through holes including arc-shaped through holes arranged around the center of the second plate part and elliptical through holes and circular through holes arranged in a peripheral portion of the second plate part, the method comprising:

setting a relative position between the first through holes and the second through holes to a first relative position corresponding to a target in-plane distribution of a film thickness of an oxide film;

supplying a first gas comprising a component of the oxide film and a diluent gas for the first gas onto the semiconductor substrate in the reactor through the first through holes not closed with the second plate part at the first relative position and supplying a first high-frequency electric power, to form the oxide film on the semiconductor substrate;

stopping the supply of the first high-frequency electric power based on a fact that a predetermined time has passed from the start of the supply of the first high-frequency electric power and stopping the supply of the first gas and the diluent gas for the first gas based on a fact that a predetermined time has passed from the start of the supply of the first gas and the diluent gas;

relatively rotating the first plate part and the second plate part to change the relative position to a second relative position corresponding to a target in-plane distribution of a film thickness of a nitride film, the second relative position being different from the first relative position in number, a cross-sectional area, or positions of the first through holes overlapping with the second through holes; and supplying a second gas comprising a component of the nitride film and a diluent gas for the second gas onto the semiconductor substrate through the first through holes not closed with the second plate part at the second relative position and controlling flow rates of the second gas and the diluent gas for the second gas to be different from flow rates of the first gas and the diluent gas for the first gas, and supplying a second high-frequency electric power, to laminate the nitride film on the oxide film; and stopping the supply of the second high-frequency electric power and stopping the supply of the second gas and the diluent gas for the second gas.

2. The method of claim 1, further comprising:

relatively moving the first plate part and the second plate part to change the relative position to the first relative position, after formation of the nitride film; and supplying the first gas onto the semiconductor substrate through the first through holes not closed with the second plate part at the first relative position, to laminate the film on the nitride film.

3. The method of claim 1, wherein supply of the first gas onto the semiconductor substrate is stopped and the first gas is discharged from the reactor, after formation of the oxide film, and the first plate part and the second plate part are rotated relative to each other to change the relative position to the second relative position, after the stop of supply of the first gas and the discharge of the first gas before supply of the second gas onto the semiconductor substrate.

4. The method of claim 2, wherein supply of the second gas onto the semiconductor substrate is stopped and the second gas is discharged from the reactor, after formation of the nitride film, and the first plate part and the second plate part are rotated relative to each other to change the relative position to the first relative position, after the stop of supply of the second gas and the discharge of the second gas before supply of the first gas onto the semiconductor substrate.

5. The method of claim 3, wherein the laminated film is formed by plasma CVD, and stop of supply of the first gas, discharge of the first gas, and rotation of the first plate part and the second plate part relative to each other are performed, while plasma is generated after formation of the oxide film.

6. The method of claim 4, wherein the laminated film is formed by plasma CVD, and stop of supply of the second gas, discharge of the second gas, and rotation of the first plate part and the second plate part relative to each other are performed, while plasma is generated after formation of the nitride film.

7. The method of claim 3, wherein the second plate part is rotated.

8. The method of claim 4, wherein the second plate part is rotated.

9. The method of claim 1, wherein the second through holes are different from the first through holes in at least one of number, a cross-sectional area, and horizontal positions.

10. The method of claim 1, wherein at least one of the second through holes has a larger inner circumference than those of the first through holes.

11. The method of claim 1, wherein at least one of the second through holes has a smaller inner circumference than those of the first through holes.

12. A semiconductor manufacturing method using a semiconductor manufacturing apparatus comprising a reactor capable of accommodating a semiconductor substrate therein and allowing a gas used for film deposition on the semiconductor substrate to be introduced thereinto, a first plate part arranged in the reactor and comprising a plurality of first through holes each have a circular shape having the same inner diameter and are arranged radially to be concentric with the first plate part, and a second plate part arranged in the reactor on a gas-downstream side of the first plate part to be opposed to the first plate part and comprising a plurality of second through holes at least one of which is different from the first through holes in shape, the second through holes including arc-shaped through holes arranged around the center of the second plate part and elliptical through holes and circular through holes arranged in a peripheral portion of the second plate part, the method comprising:

setting a relative position between the first through holes and the second through holes to a first relative position corresponding to a target in-plane distribution of a film thickness of a first film;

supplying a first gas comprising a component of the first film and a diluent gas for the first gas onto the semiconductor substrate in the reactor through the first through holes not blocked with the second plate part at the first relative position and supplying high-frequency electric power into the reactor, to form the first film on the semiconductor substrate;

stopping the supply of the first gas onto the semiconductor substrate and discharging the first gas from the reactor;

relatively rotating the first plate part and the second plate part to change the relative position to a second relative position corresponding to a target in-plane distribution of a film thickness of a second film; and supplying a second gas comprising a component of the second film and a diluent gas for the second gas onto the semiconductor substrate through the first through holes not closed with the second plate part at the second relative position and controlling flow rates of the second gas and the diluent gas for the second gas to be different from flow rates of the first gas and the diluent gas for the first gas, to laminate the second film on the first film;

stopping the supply of the second gas onto the semiconductor substrate and discharging the second gas from the reactor;

relatively moving the first plate part and the second plate part to change the relative position to the first relative position;

and supplying the first gas onto the semiconductor substrate through the first through holes not closed with the second plate part at the first relative position, to laminate the first film on the second film.

13. A semiconductor manufacturing method using a semiconductor manufacturing apparatus comprising a reactor capable of accommodating a semiconductor substrate therein and allowing a gas used for film deposition on the semiconductor substrate to be introduced thereinto, a first plate part arranged in the reactor and comprising a plurality of first through holes each have a circular shape having the same inner diameter and are arranged radially to be concentric with the first plate part, and a second plate part arranged in the reactor on a gas-downstream side of the first plate part to be opposed to the first plate part and comprising a plurality of second through holes at least one of which is different from the first through holes in shape, the second through holes including arc-shaped through holes arranged around the center of the second plate part and elliptical through holes and circular through holes arranged in a peripheral portion of the second plate part, the method comprising:

alternately supplying a first gas comprising a component of a first film and a diluent gas for the first gas, and a second gas comprising a component of a second film and the diluent gas for the second gas onto the semiconductor substrate in the reactor through the first through holes not blocked with the second plate part and supplying high-frequency electric power into the reactor, to form a laminated film comprising the first film and the second film alternately laminated on the semiconductor substrate; and relatively rotating the first plate part and the second plate part to make a relative position between the first through holes and the second through holes different between when the first film is formed and when the second film is formed and controlling flow rates of the second gas and the diluent gas for the second gas to be different from flow rates of the first gas and the diluent gas for the first gas, wherein the laminated film is formed by plasma CVD, while plasma is generated after the first film is formed in a state that the relative position is set to a first relative position, supply of the first gas is stopped, the first gas is discharged from the reactor, and the relative position is changed from the first relative position to a second relative position, and while the relative position is set to the second relative position and plasma is generated after formation of the second film, supply of the second gas is stopped, the second gas is discharged from the reactor, and the relative position is changed from the second relative position to the first relative position.

* * * * *